(12) United States Patent
Richter et al.

(10) Patent No.: US 11,232,917 B2
(45) Date of Patent: Jan. 25, 2022

(54) ELECTRONIC SMART SWITCH

(71) Applicants: Wolfgang Richter, Vancouver (CA); Faranak Zadeh, Vancouver (CA)

(72) Inventors: Wolfgang Richter, Vancouver (CA); Faranak Zadeh, Vancouver (CA)

(73) Assignee: EPIC SEMICONDUCTORS INC

( * ) Notice: Subject to any disclaimer, the term of this patent is extended or adjusted under 35 U.S.C. 154(b) by 0 days.

(21) Appl. No.: 17/245,977

(22) Filed: Apr. 30, 2021

(65) Prior Publication Data

US 2021/0343486 A1 Nov. 4, 2021

Related U.S. Application Data

(60) Provisional application No. 63/018,958, filed on May 1, 2020.

(51) Int. Cl.
*H01H 9/54* (2006.01)
*H02J 50/00* (2016.01)
*G11C 19/28* (2006.01)

(52) U.S. Cl.
CPC .............. *H01H 9/54* (2013.01); *H02J 50/001* (2020.01); *G11C 19/28* (2013.01)

(58) Field of Classification Search
CPC .......................................................... H01H 9/54
See application file for complete search history.

(56) References Cited

U.S. PATENT DOCUMENTS

| 9,092,129 | B2* | 7/2015 | Abdo | G06F 3/04883 |
| 9,369,824 | B2* | 6/2016 | Richter | G06Q 30/0241 |
| 9,509,178 | B2* | 11/2016 | Richter | H02J 3/00 |
| 10,441,874 | B2* | 10/2019 | Richter | A63F 3/00643 |
| 10,489,342 | B2* | 11/2019 | Richter | G06F 15/76 |
| 11,093,042 | B2* | 8/2021 | Richter | G06F 3/04164 |
| 2012/0004523 | A1* | 1/2012 | Richter | A61B 5/0002 600/345 |
| 2012/0112828 | A1* | 5/2012 | Richter | H02J 50/05 327/564 |
| 2021/0228103 | A1* | 7/2021 | Richter | A61B 5/0537 |

* cited by examiner

*Primary Examiner* — Patrick O Neill

(57) ABSTRACT

Disclosed is a system for allowing a user to control electrical items. The system includes self-powered contactless one or more switches for controlling the electronic items, and a hub unit capacitively coupled to identify the user operating the one or more switches. The hub unit includes a frequency generator, a first impedance unit, a controller, a first electrode, a modulator, and an interface unit. The switch includes a second electrode, a rectifier, a buffer, a second impedance unit, a logic block, a shift register, and a second modulator. The user interacts with the second electrode to operate the connected electrical items. The interaction results in the change of a variable payload data. The controller identifies the interaction on decoding the change in the variable payload data and further the controller operates the connected electrical items.

15 Claims, 4 Drawing Sheets

ELECTRONIC SMART SWITCH

CROSS-REFERENCE TO RELATED ART

The present application claims benefit of priority from U.S. Provisional Application No. 63/018,958, filed May 1, 2020, which is incorporated herein by reference in its entirety.

BACKGROUND OF THE INVENTION

1. Field of the Invention

The present invention generally relates to a smart switch, and more particularly relates to an electronic switch configured to be self-powered, and operates wirelessly for identifying users and their actions.

2. Description of Related Art

Electrical or electronic switches are often used to manually control machines or devices. They often come in the form of two separate conductive surfaces in a housing that is typically mounted on a front panel of a device, a machine or a vehicle. If a user applies a force to a pusher in the housing, the two conductive forces join to close or open an electric circuit.

Therefore, such switch is wired to a controller either directly by soldering or screwing or utilizing connectors that are useful for preferably quick (dis-) assembling. Some electronic or electric switches may be secured against unauthorized use by being mechanically locked with a key.

Until now, it was not possible for electrical/electronic switches to identify users or perform different actions for different users. A variation of electronic switches are knobs and sliders which allow users to enter or change values in a controller. The art knows pressure-sensitive switches e.g. for keyboards in electronic musical instruments where the user can enter values into a controller that change with the pressure of the finger.

The art also teaches the use of wireless switches that are either battery operated or equipped with a mechanical energy harvester, e.g. in the form of a piezo or magnetodynamic generator. Again, none of those identifies a user during operation. In fact, identifying users requires additional efforts.

Therefore, there is a need of a system that allows to identify a user to control electrical/electronic items. The system includes a wireless battery-free self-powered electronic switch that can be freely arranged (fixed or movable) on surfaces in reach of a user, further may also be called "Smart Switches". Further, the switch should recognize approach, touch and applied mechanical pressure.

SUMMARY OF THE INVENTION

This invention describes an electronic circuit which resembles a contactless multifunction switch. The circuit is self-powered and operates without being connected to a controller via wires. Instead, the invention uses an alternating electric field which propagates over the user to power and operate the features of the switch. Therefore, the circuit acts as a kind of a capacitive sensing unit which may distinguish between approach, touch and pressure.

An array of such switches may work as a 3D gesture recognizing system or as a slider with the features that a user's hand can hover over the array or touch the array or apply pressure in certain areas of the array. The switch may be used to operate functions e.g. of a machine or in a vehicle. For example, in a car the switch may distinguish between a driver and a passenger so that they may share a switch (e.g. for seat-window-climate controls, etc.) or are blocked or unable to invoke functions depending on their seat position.

The invention related circuitry works with any MCU base station and performs periodic cycling proof of proper functionality for safety and security features. The electronic circuit works wirelessly by modulating and demodulating data from and to an alternating electric field, sensing values of a user's action and/or environmental forces. The sensing results may be wirelessly simultaneously analog/digital transferred to the MCU base station. Multichannel communication is possible.

The invention also introduces a smart share function wherein an array one switch may monitor another one in reach e.g. for interpreting a user's gestures. As a capacitively coupled and operated system, the circuit consists of electrodes that may be coated for special sensing. Possible coatings (not limited) may be piezo crystals or coil structures to be sensitive e.g. to NFC smartphone connections. A piezo coated electrode also offers the feature to act as an audio signal source for example to acknowledge a key press with a sound (beep).

Piezo coating may further act as a microphone to give voice commands to a system. Electronic switches built with the invention related circuitry may contain LEDs or other illumination sources to make multicolor RGB illumination. A special version may be equipped with UV light emitting sources which may be used for disinfection purposes or to illuminate fluorescent material and masked to create symbols recognizable by the user. Further, the switch may be configured to receive light signals e.g. Infrared commands.

The circuitry is also able to power and operate displays like e-ink, OLED, LCD or TFT, etc. to enable digital signage or present information. Because of the capacitive coupling to a user's hand, distance measurement is possible to analyze the dynamics of a user's action. Depending on the local placement, the switches may be also operated with other body parts like the feet or the head of the user. The circuitry may be housed in various shapes from simple Switches and normal-looking switches like up to bolts, screws, rivets, etc. or may be hidden under surfaces or molded into polymers or fabrics.

Conductive polymers or metals may be used as electrodes. They may also be part of the structure of a machine or a vehicle. As the circuitry is self-powered, it contains an integrated energy harvester to perform "always-on" operation. It may operate synchronized with other electronic switches of the same kind in an array and may be designed to operate in selected time slots to avoid data collision. Besides this, the electronic may always send a permanent signal to ensure that it is working and fully functional.

BRIEF DESCRIPTION OF DRAWINGS

The annexed drawings, which are not necessarily to scale, show various aspects of the inventions in which similar reference numerals are used to indicate the same or similar parts in the various views.

DETAILED DESCRIPTION OF DRAWINGS

Figure 1:
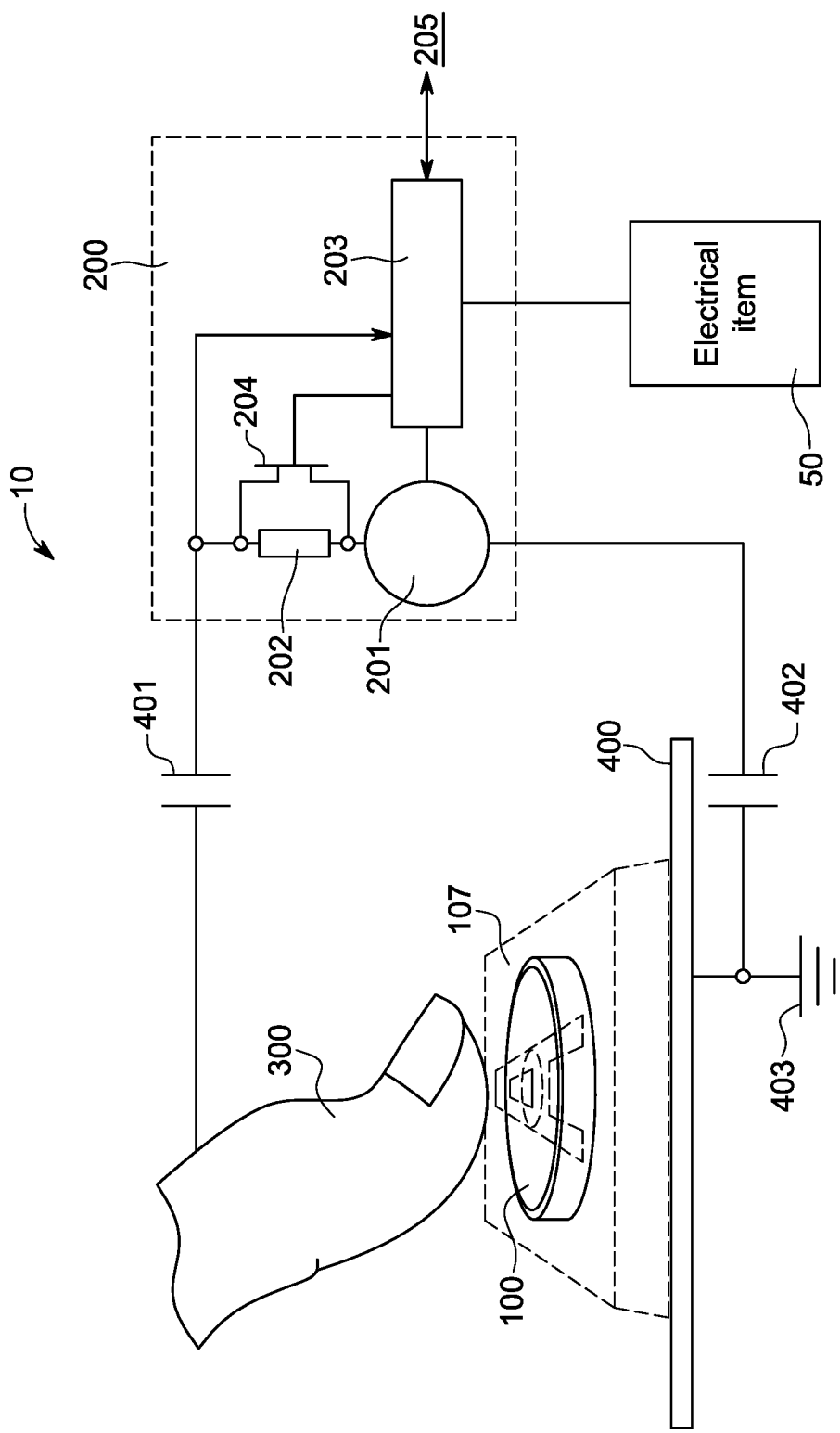
FIG. 1 illustrates a schematic diagram of an electronic switch allowing a user to control electrical items.

The present disclosure is now described in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

FIG. 1 illustrates a schematic diagram of a system 10 for allowing a user 300 to control electrical items 50. The system 100 includes one or more switches 100 for controlling the electronic items 50, and a hub unit 200 capacitively coupled to the switch 100 for identifying the one or more switches 100, operated by the user 300. The one or more switches are explained in detailed in conjunction with FIG. 2 and FIG. 3 of the present invention.

The hub unit 200 includes a frequency generator 201, a first impedance unit 202, a controller 203, a first electrode 401, a modulator 204, and an interface unit 205. The frequency generator 201 generates controllable frequency. The oscillation may be realized in a hardware or a software controlled by the controller 203. In an exemplary embodiment, the frequency generator 201 oscillates e.g. 500 KHz.

Examples of the frequency generator 201 include but not limited to an oscillator, PWM, toggled I/O pin, etc. The frequency generator 201 emits an alternating electric field on the first (coupling) electrode 401 over the impedance unit 202. The first impedance unit 202 resonates impedance with a matching frequency, typically as a LC combination. Examples of the first impedance unit 202 include but not limited to a resonator, SAW, Quartz or crystals, coils, inductors, in series with capacitors.

The controller 203 modulates the impedance with a data. The controller 203 further decodes changes in the impedance. Examples of the controller 203 include but not limited to a microcontroller (MCU), CPLD, FPGA etc. with connected peripherals (I/O Ports, UARTS, WiFi, Displays, ADC, DAC etc.).

The first electrode 401 emits an alternating electric field from the resonating frequency received from the impedance unit 202. The modulator 204 changes the impedance of the impedance unit 202 on the modulation of the controller 203 to modulate the alternating electric field with the data. Examples of the modulator 204 include but not limited to a MOSFET, Transistor, opto-coupler, MEMS switch, etc. The change in the modulation is in the form of a code pattern.

The interface unit 205 communicates the data. Further, the interface unit 205 communicates the commands over a communication network. Examples of the interface unit 205 include but not limited to a RF transceiver, serial connection, LAN, WAN, CAN, LIN, Bluetooth, NFC, Wi-Fi and other similar communication devices, etc.

In another embodiment of the invention, the switch 100 is configured on a surface 400 and is housed inside a housing 107. The housing 107 acts as a covering for the switch 100. The surface 400 has an indirect connection to an electrical ground potential 403. The electrical ground potential may be earth, a vehicle body, a metallic or a conductive surface, etc.

Examples of the surface 400 include but not limited to a vehicle seats for driver or passengers, panels of machine, keyboards, furniture, shelves, etc. It would be readily apparent to those skilled in the art that various type of surfaces 400 may be envisioned as a conductive surface without deviating from the scope of the present invention.

The user's 300 skin builds the other side of the first electrode 401 as a capacitive coupling and is influenced by the alternating electric field via electron entanglement. The user 300 either approaches or squeezes the switch 100, which results in the impedance change and a related signal is received from the controller 203. Further, the controller 203 processes the related signals (such as identification of the switch, user's action and any commands), which is further communicated via the interface 205.

The system 10 always couples against the ground 403 through a ground coupling 402 that closes the alternating current (AC) circuit and reduces electrical noise. The interface unit 205 communicates with devices, computers, sensors, actors, servers, AI, classifiers, machine learning, etc.

Examples of the electrical items 50 include but not limited to electrical operable actuators, illumination devices, electronic devices, sound systems, pumps, power steering, power windows, steering wheels, electric doors, electric lockers, electro-mechanical systems etc. It would be readily apparent to those skilled in the art that various types of electrical items 50 may be envisioned without deviating from the scope of the present invention.

Figure 2:
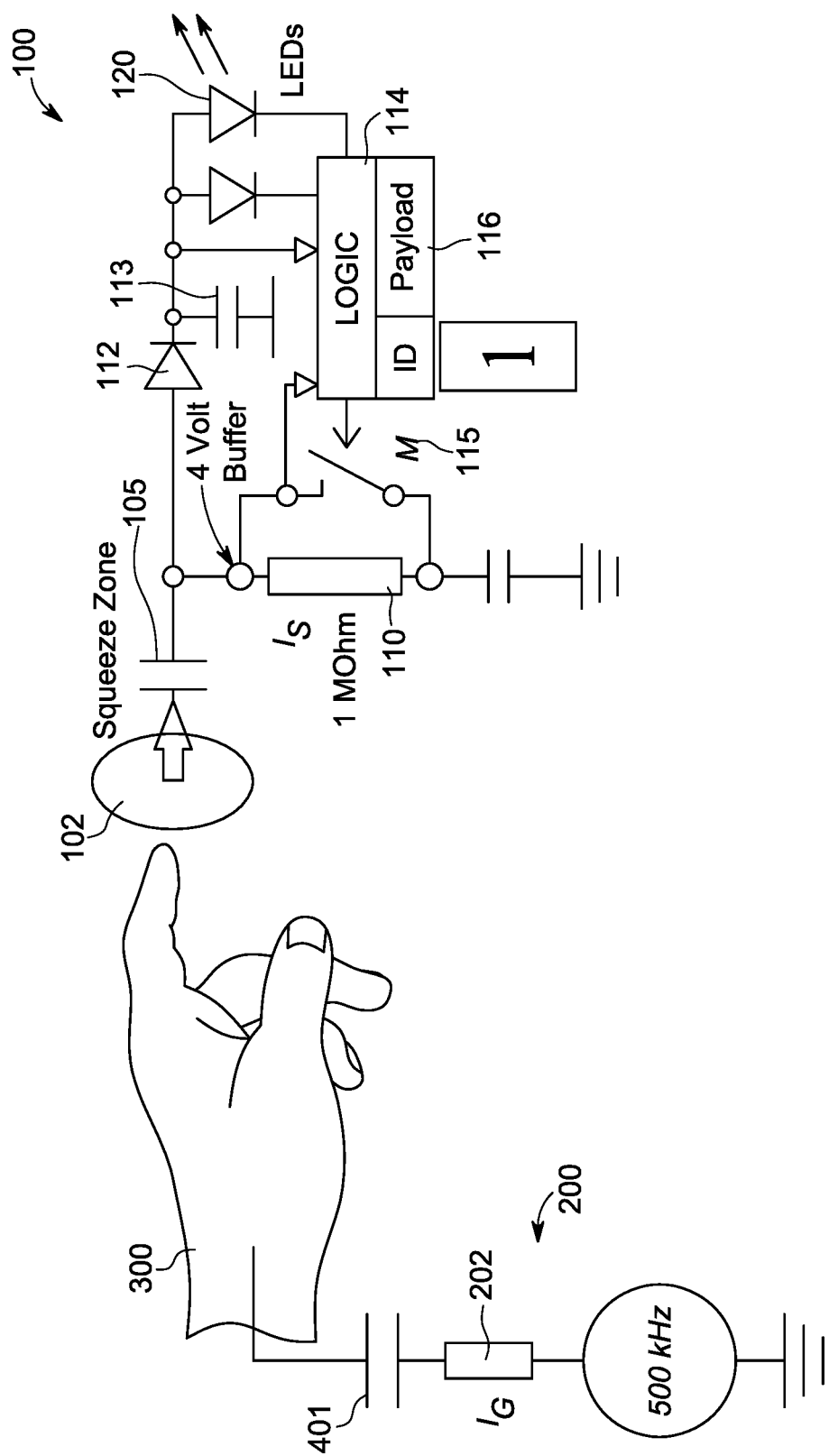
FIG. 2 illustrates a schematic diagram of the electronic switch interacting with the user.

FIG. 2 illustrates a schematic diagram of a switch 100 interacting with the user 300. The switch 100 includes a second electrode 102, a rectifier 112, a buffer 113, a second impedance unit 110, a logic block 114, a shift register 116, and a second modulator 115. The second electrode 102 is influenced by the modulated (by first modulator 204, shown in FIG. 1) alternating electric field emitted from the first electrode 401 over the user 300.

The rectifier 112 converts the alternating electric field into a DC energy. The buffer 113 stores the DC energy. Further, the buffer 113 removes the ripple from the DC energy. Examples of the rectifier 112 include but not limited to diodes, MOS switches, etc. Examples of the buffer 113 include but not limited to a capacitor, accumulator, silicon battery, polymers, etc.

The second impedance unit 110 creates a load for the alternating electric field causing an AC voltage with the alternating electric field's frequency produced by the hub unit 200 (e.g. 500 kHz). The field's strength, frequency, and level are high enough to create a voltage (e.g. 4V) on the second impedance IS unit 110 of the circuitry.

The logic block 114 is powered from the buffer and clocked from the AC voltage. The AC voltage is clamped by the rectifier 112. Examples of the logic block 114 include but not limited to a counter, divider, arrangements of logic gates, ALU, configurable gate arrays, etc. For exemplary purposes, the logic block 114 signalize such events by e.g. switching LEDs (on/off) or releasing an audio signal. The logic block 114 also converts the sine wave of the alternating electric field into a rectangle and uses it as a synchronized system clock.

The shift register 116 contains an identification data and a variable payload data. The variable payload data is representing the field strength of the alternating electric field. The identification data and the variable payload data are serial modulated into the alternating electric field by the second modulator 115 and is received on the impedance IG unit 202 for processing, wherein the logic block 114 derives a related shift and modulation frequency.

The second modulator 115 modulates the second impedance unit 110 with the identification data and variable payload data to be received by the first impedance unit 202 via the alternating electric field. Examples of the second modulator 115 include but not limited to a MOSFET, Transistor, opto-coupler, MEMS switch, etc.

The user 300 interacts with the second electrode to operate the connected electrical items (50, shown in FIG. 1). The interaction results in the change of the variable payload data. The controller 203 identifies the interaction on decoding the change in the variable payload data and further the controller 203 operates the connected electrical items (50, shown in FIG. 1).

Figure 3:
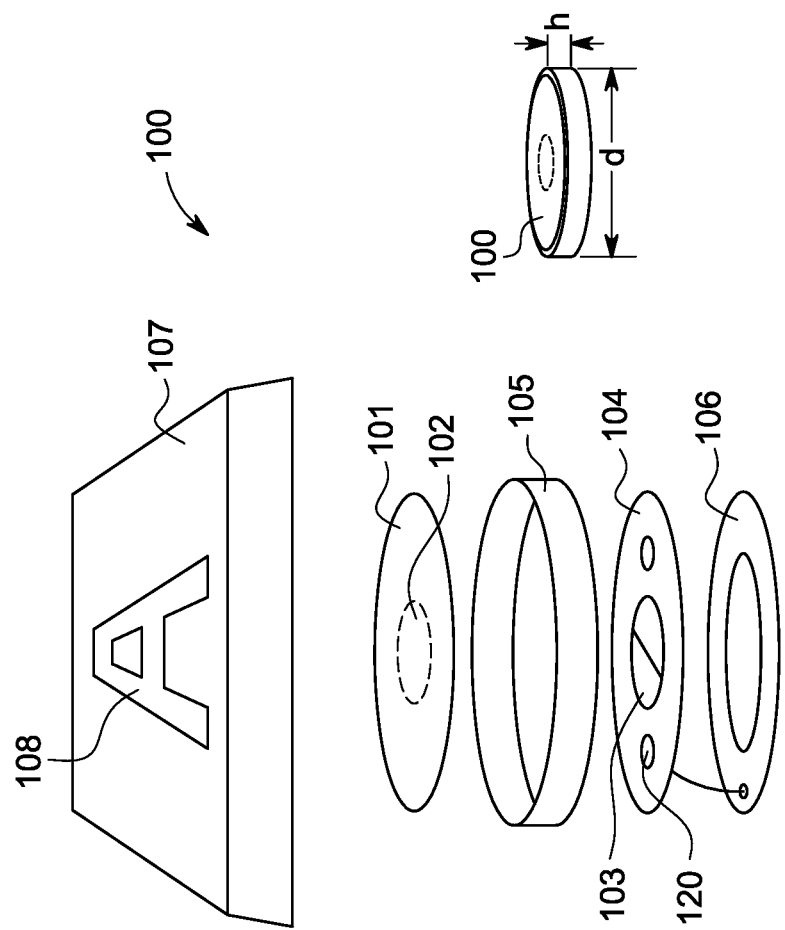
FIG. 3 illustrates an exploded view of the electronic switch.

In another embodiment of the present invention, the switch 100 further includes a squeeze unit 105 configured between the second electrode 102 and a third electrode (103, shown in FIG. 3) with an elastic dielectric polymer in between e.g. in a form of a ring (shown and explained in FIG. 3 of the present invention). The user 300 performs pressure to the electrode 102, the squeeze unit 105 and the second electrode 102 & a third electrode (103, shown in FIG. 3) come closer together related to the pressure, which again changes the voltage level's intensity on the second impedance unit 110.

For exemplary purposes, the user 300 approaches the electrode 102 e.g. with a finger, the capacitive coupling gets stronger and the voltage on the second impedance unit IS 110 gets higher. This changes the value of the payload data which is transmitted to the impedance IG unit 202. By touching the electrode 102 (coated in insulating material), the dielectric air between the user's hand 300 and the switch 100 is eliminated which abruptly raises the input level so that the touch is recognized.

In another exemplary embodiment, If the user 300 increases the pressure further, the electrodes 102 and 103 join and form a mechanical switch. This would result in the maximum voltage measurable on the second impedance unit 110. The system 10 has means to measure the voltage and puts the digitized value in the payload and modulates it back by the second modulator 115 to be received by the generator's impedance IG 202.

In another exemplary embodiment, the squeeze unit 105 is equipped with a spring mechanism to resemble a "click" to give a more tactile or haptic feeling to the user 300. Further in exemplary embodiment, the user 300 presses the second electrode 102, the third electrode (103, shown in FIG. 3) of the squeeze unit 105 together and then release it to a lower finger pressure level and then increases the finger pressure level again to control e.g. the speed of ventilation or the degree of an air-conditioning system, electromechanical adjustments, sound or an illumination etc. It would be readily apparent to those skilled in the art that various forms of the squeeze zone capacitor 105 may be envisioned without deviating from the scope of the present invention.

The switch 100 further includes LEDs 120 for illuminating. The LEDs 120 may either be multicolor and/or UV LED. The LEDs 120 may be used as a UV flash to sterilize the touch surface after touch to avoid any bacterial/viral growth. The intensity of illumination of LEDs 120 may be proportional to the nearness of the user. The LED 120 light dims (up or down) if a hand approaches. It would be readily apparent to those skilled in the art that various functions/features of LEDs 120 may be envisioned without deviating from the scope of the present invention.

In another embodiment of the present invention, the user 300 approaches/squeezes the switch 100, it results in impedance change and a related signal is received from the controller 203 and further processes into the interface unit 205. The system 10 always couples against the ground 403 through the ground coupling 402 that closes the alternating current (AC) circuit and reduces electrical noises, where the ring electrode (106, shown in FIG. 3) floats to the ground 403. Alternatively, the switch 100 is influenced by an alternating electric field and the user builds the ground (which makes no difference in an alternating current circuit).

FIG. 3 illustrates an exploded view of the electronic switch 100 in an exemplary embodiment. The electronic switch 100 is a cylinder shaped button with the diameter D of e.g. 1 cm and a height H of 3-5 mm. The switch 100 includes a printed circuit board 104, a third electrode 103 placed on top of the printed circuit board 104, a squeeze unit 105 positioned around the printed circuit board 104, a ring electrode 106 connected to the printed circuit board 104, and a semi-transparent disc 101 is placed on top of the printed circuit board 104.

The semi-transparent disc 101 is configured of material such as polymer which is reactive to a fluorescent light. The disc 101 diffuses illumination and is insulated dielectric and may be fluorescent. The third electrode 103 is divided in its diameter and the contact with the electrode 102 bridges the gap to resemble a mechanical switch. The switch 100 is able to sense approach, touch and pressure including tactile feedback. The electrode 102, 103 are piezo coated to receive voice commands or release sounds.

The switch 100 is attached to a housing, coating or painting 107 which may include transparent masking to show symbols which may be illuminated from the LED's 120 through the translucent material 101 to give a homogenous performance. The ring electrode 106 is of a conductive (optional elastic) material, preferably changing its resistance or impedance on pressure (e.g. Velostat, FSR, etc.).

In another embodiment, the electrodes 102 and 103, are bifilar flat coil structure to be more resistant against electromagnetic influence. The switch 100 further contains a mark 108. Examples of the mark 108 include but not limited to a symbol, tiny displays, e-ink, OLED, LCD etc. that illuminates or appears on demand.

Figure 4:
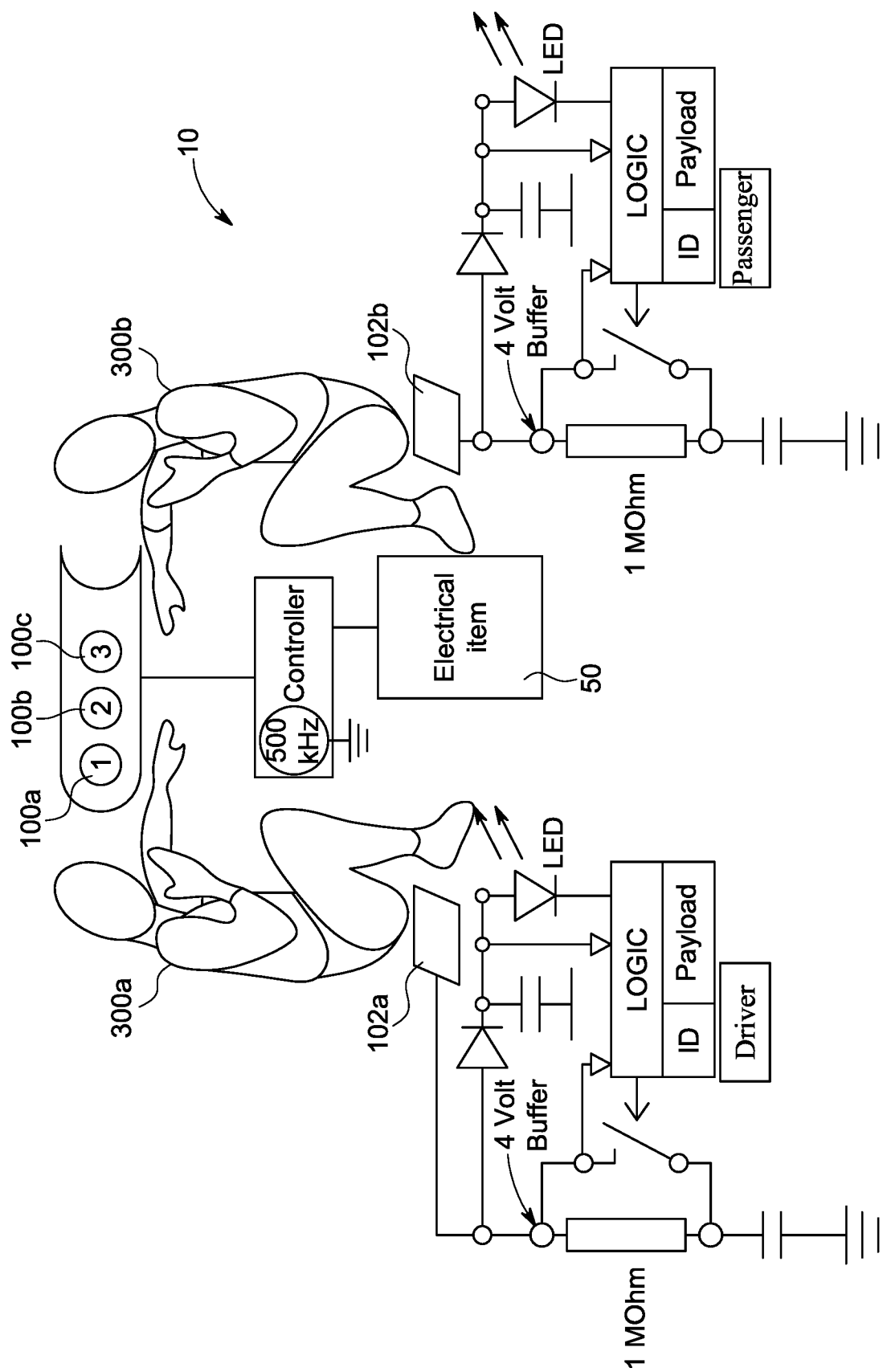
FIG. 4 illustrates another schematic drawing to show a driver and a passenger operating the electronic device through the electronic switch.

FIG. 4 illustrates another schematic drawing to show a driver 300a and a passenger 300b of a vehicle, operating the electrical item 50 through electronic switches 100a,b,c. In an exemplary embodiment, the output of the frequency generator (201) is switched to different field emitting electrodes (102a & 102b) placed in the seat e.g. of a car's driver 300a or a passenger 300b.

The switching is alternating and recognized, so if either of the driver 300a or the passenger 300b reaches or activates one of the switch 100a,b,c (or access point) this closes the AC circuit. The system 10 recognize who of those (driver 300a or passenger 300b) is operating the (therefore shareable) smart switch.

The system 10 detects the change in the alternating current field and is also able to detect the direction of approach through the stored identification data in each switch 100a,b,c. In another embodiment of the present invention, at least one of the plurality of switches 100 are embedded into e.g. seats to measure the weight (or sense the movements) of a person seated on it and also identify the person when he/she operates the electrical items. The system 10 synchronizes to create a digital time slot, therefore, data collisions are always avoided, regardless of the number of switches 100 are used to perform an operation.

The present invention offers various advantages such as a contactless switch, offering a new level of freedom for smart devices. The present invention further distinguishes between approach, touch and pressure with an array of switches that work as a 3D gesture recognition system, telling apart between driver and passenger in a vehicle so they may share switches for the same commands.

In a special embodiment of the invention, a person could carry an invention related smart Switch e.g. as a batch, embedded in shoes, clothes, equipment, protection gear, tools etc. Coming in reach of the influence of said alternating electric field, the person and/or the equipment can be identified by the controller e.g. for security/safety purposes.

The smart switches test themselves permanently and are able to receive external operation codes or identifiers. Further, the smart switches are connected and operated via alternating electron entanglement based on field electric interdependence. The invention's circuitry contains means to harvest electrical energy from surfaces to operate itself and connected peripherals like LEDs, displays, or other feedback devices like buzzers or other actuators (e.g. for haptic feedback).

In another preferably embodiment, the invention related smart switches build self-organized sensing arrays that are also able to detect 3D gestures of users or their local orientation (e.g. seat position). As a special feature of the invention, the switches may be embedded e.g. in wood, plastic, polymers, fabrics, metal structures, etc. for sensing physical or chemical properties of the connected electrical items. Further, the switches may be configured with various sensors to facilitate in sensing physical and chemical properties of the electrical items or environment.

Although the inventions have been shown and described with respect to a certain embodiment or embodiments, equivalent alterations and modifications will occur to others skilled in the art upon the reading and understanding of this specification and the annexed drawings. In particular regard to the various functions performed by the above describe elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the inventions. In addition, while a particular feature of the inventions may have been described above with respect to only one or more of several illustrated embodiments, such feature may be combined with one or more other features of the other embodiments, as may be desired and advantageous for any given or particular application.

The invention claimed is:

1. A system for allowing a user to control electrical items, the system comprising:
    one or more switches for controlling the electrical items; and
    a hub unit capacitively coupled to the switch for identifying the one or more switches operated by the user; the hub unit comprising:
        a frequency generator for generating controllable frequency;
        a first impedance unit to resonate impedance with a matching frequency;
        a controller for modulating the impedance with data, further the controller decodes changes in the impedance;
        a first electrode to emit an alternating electric field from the resonating frequency received from the impedance unit;
        a modulator to change the impedance of the impedance unit on the modulation of the controller to modulate the alternating electric field with the data; and
        an interface unit for communicating the data and commands over a communication network;
    wherein each of the one or more switches comprising:
        a second electrode influenced by the modulated alternating electric field emitted from the modulator via the first electrode;
        a rectifier for converting the alternating electric field into a DC energy;
        a buffer for storing the DC energy, further the buffer removes the ripple from the DC energy;
        a second impedance unit creates a load for the alternating electric field causing an AC voltage with the alternating electric field's frequency;
        a logic block powered from the buffer and clocked from the AC voltage, wherein the AC voltage is clamped by the rectifier;
        a shift register containing identification data and variable payload data, wherein the variable payload data is representing the field strength of the alternating electric field, wherein the logic block derives a shift and a carrier frequency;
        a second modulator modulates the second impedance unit with the identification data and variable payload data to be received by the first impedance unit via the alternating electric field;
    wherein the user interacts with the second electrode to operate the connected electrical items, wherein the interaction results in the change of the variable payload data,
    wherein the controller identifies the interaction on decoding the change in the variable payload data and further the controller operates the connected electrical items.

2. The system according to claim 1, wherein the user interaction with the switch is at least one of: approaching; passing; touching; and squeezing.

3. The system according to claim 1, wherein the plurality of switches configured together for gesture detection of the users to operate the electrical items.

4. The system according to claim 1 wherein the electrodes are coated for communicating audio signals.

5. The system according to claim 1 wherein the interface unit receives commands for operating the electrical items from a remote location.

6. The system according to claim 1 wherein the switch allows the user to operate the electrical items only in the presence of a verified identifier.

7. The system according to claim 1 further comprising a housing to cover the switch.

8. The system according to claim 7 wherein the housing closes the circuit against a ground potential.

9. The system according to claim 1 wherein the controller is able to identify interaction of multiple users with the switch.

10. The system according to claim 1 wherein the switch further comprising a squeeze unit to detect applied mechanical forces.

11. The system according to claim 10, wherein the squeeze unit comprising a third electrode to create variable capacitance with the second electrode; and a dielectric elastic polymer configured between the third electrode and the second electrode.

12. The system according to claim 11, wherein the third electrode is divided in its diameter to create an electromechanical switch with the second electrode.

13. The system according to claim 1 wherein the controller identifies the user operating the switch.

14. The system according to claim 1, wherein the switch further comprising one or more sensors to measure chemical and physical properties.

15. The system according to claim 1, wherein the switch further comprising one or more LEDs for illuminating on receiving commands from the controller.

* * * * *